(12) United States Patent
Ho

(10) Patent No.: US 11,019,757 B2
(45) Date of Patent: May 25, 2021

(54) BACK COVER MODULE

(71) Applicant: Wistron Corporation, New Taipei (TW)

(72) Inventor: Ray Ho, New Taipei (TW)

(73) Assignee: Wistron Corporation, New Taipei (TW)

( * ) Notice: Subject to any disclaimer, the term of this patent is extended or adjusted under 35 U.S.C. 154(b) by 723 days.

(21) Appl. No.: 15/937,867

(22) Filed: Mar. 28, 2018

(65) Prior Publication Data

US 2019/0230827 A1 Jul. 25, 2019

(30) Foreign Application Priority Data

Jan. 22, 2018 (TW) .................................. 107102152

(51) Int. Cl.
*H05K 7/14* (2006.01)
*H05K 9/00* (2006.01)
*F16B 5/02* (2006.01)

(52) U.S. Cl.
CPC ........... *H05K 9/002* (2013.01); *F16B 5/0225* (2013.01); *H05K 7/1438* (2013.01); *H05K 9/0062* (2013.01)

(58) Field of Classification Search
CPC ... H05K 7/1438; H05K 9/0062; H05K 7/1441
See application file for complete search history.

(56) References Cited

U.S. PATENT DOCUMENTS

| 4,821,146 | A | * | 4/1989 | Behrens | H05K 7/1461 174/383 |
| 4,970,625 | A | * | 11/1990 | Belanger | H05K 7/1414 174/382 |
| 6,309,037 | B2 | * | 10/2001 | Bertolami | H05K 7/1429 312/223.2 |
| 6,349,041 | B1 | * | 2/2002 | Hayward | H05K 7/1425 174/365 |
| 7,684,213 | B2 | * | 3/2010 | Titus | G06F 1/182 361/818 |
| 7,813,143 | B2 | * | 10/2010 | Dorenkamp | H05K 7/1425 361/797 |

(Continued)

FOREIGN PATENT DOCUMENTS

| CN | 102037799 | 4/2013 |
| CN | 204086331 | 1/2015 |
| CN | 204203305 | 3/2015 |

*Primary Examiner* — Hung V Ngo
(74) *Attorney, Agent, or Firm* — JCIPRNET

(57) ABSTRACT

A back cover module adapted to be disposed on a casing having a back opening is provided. The back cover module includes a fixing bracket, a sliding bracket and a rotating mask. The sliding bracket is slidably disposed on the fixing bracket along a first direction. The rotating mask is pivoted to the sliding bracket. When the fixing bracket is fixed to a position of the casing adjacent to the back opening, the fixing bracket and the sliding bracket are adapted to be inside the casing and a portion of the rotating mask is exposed from the casing. The rotating mask is adapted to follow the sliding bracket and move relative to the fixing bracket toward the first direction to a position out of the casing, and is adopted to rotate relative to the sliding bracket and shield the back opening after being moved out of the casing.

12 Claims, 11 Drawing Sheets

(56) References Cited

U.S. PATENT DOCUMENTS

| | | | |
|---|---|---|---|
| 7,881,052 B2* | 2/2011 | Crippen | H05K 9/0062 |
| | | | 361/679.37 |
| 7,969,748 B2 | 6/2011 | Niederkorn et al. | |
| 9,077,108 B2* | 7/2015 | Molnar | H05K 7/1474 |
| 10,034,405 B2* | 7/2018 | Bailey | H01L 23/473 |
| 2003/0117768 A1* | 6/2003 | Marcotte | H05K 7/1439 |
| | | | 361/600 |
| 2003/0227759 A1* | 12/2003 | Haworth | H05K 7/1495 |
| | | | 361/800 |
| 2005/0133236 A1* | 6/2005 | Megason | G06F 1/185 |
| | | | 174/51 |
| 2011/0032692 A1 | 2/2011 | Niederkorn et al. | |
| 2021/0057000 A1* | 2/2021 | Van Pelt | H05K 7/1411 |

* cited by examiner

BACK COVER MODULE

CROSS-REFERENCE TO RELATED APPLICATION

This application claims the priority benefit of Taiwan application serial no. 107102152, filed on Jan. 22, 2018. The entirety of the above-mentioned patent application is hereby incorporated by reference herein and made a part of this specification.

BACKGROUND

Field of the Disclosure

The disclosure is related to a back cover module.

Description of Related Art

Along with advancement of technologies, functions of server have been developed to be versatile and customized. For serves with the same casing the motherboard, generally various types of expansion modules are provided for consumers' selection. Typically, the expansion modules takes up the space at the back of casing and therefore an opening is reserved in advance at the back of casing. With the simplest configuration, an iron mask is required to fill the opening at the back of casing to shield leakage of electromagnetic wave. However, when such opening is used for installing the expansion module, the iron mask needs to be removed, and abandoned iron masks result in a large amount of waste iron and thus causing pollution to environment.

SUMMARY

The disclosure provides a back cover module which can be received in a casing without being removed.

The embodiment of the disclosure provides a back cover module adapted to be disposed on a casing. The casing has a back opening. The back cover module includes a fixing bracket, a sliding bracket and a rotating mask. The fixing bracket is adapted to be fixed to a position of the casing adjacent to the back opening. The sliding bracket is slidably disposed on the fixing bracket along a first direction. The rotating mask is pivoted to the sliding bracket, wherein when the fixing bracket is fixed to the casing, the fixing bracket and the sliding bracket are adapted to be disposed in the casing and a portion of the rotating mask is exposed from the casing. The rotating mask is adapted to follow the sliding bracket and move relative to the fixing bracket toward the first direction to a position out of the casing, and is adapted to rotate relative to the sliding bracket and shield the back opening after being moved out of the casing.

In an embodiment of the disclosure, one of the fixing bracket and the sliding bracket includes a sliding slot extending along the first direction, and the other one includes a sliding portion extending in the sliding slot.

In an embodiment of the disclosure, the sliding slot includes an inlet area and a sliding area distributed along the first direction. The sliding portion includes a body and a cap portion connected to the body; the width of the inlet area is larger than the width of the cap portion; the width of the cap portion is larger than the width of the sliding area; the width of the sliding area is larger than the width of the body.

In an embodiment of the disclosure, the sliding portion includes a first segment and a second segment that are connected and bended. The first segment extends along a second direction, the second segment extends along a third direction, wherein the first direction, the second direction and the third direction are perpendicular to each other.

In an embodiment of the disclosure, the sliding slot includes an inlet area and a sliding area distributed along the first direction, wherein in the third direction, the width of the inlet area is larger than the width of the second segment, the width of the sliding area is larger than the width of the first segment, and the width of the inlet area is larger than the width of the sliding area.

In an embodiment of the disclosure, the sliding slot includes a shrinking area adjacent to one end of the sliding slot and is divided into a positioning area and a sliding area.

In an embodiment of the disclosure, the sliding portion includes a bump, the widths of the positioning area and the sliding area are larger than the width of the bump, and the width of the shrinking area is smaller than the width of the bump.

In an embodiment of the disclosure, on the fixing bracket or the sliding bracket on which the sliding slot is disposed, a hole is disposed on a portion of a periphery of one end of the sliding slot.

In an embodiment of the disclosure, one of the fixing bracket and the sliding bracket includes a position-limiting spring arm, and the other one includes a first positioning hole and a second positioning hole, wherein when the sliding bracket is located at a starting position, a protrusion of the position-limiting spring arm engages the first positioning hole. When the sliding bracket is located at a terminal position, the protrusion of the position-limiting spring arm engages the second positioning hole.

In an embodiment of the disclosure, on the fixing bracket or the sliding bracket on which the first positioning hole is disposed, a first sidewall forming the first positioning hole and a second sidewall forming the second positioning hole are two inclined surfaces respectively. The protrusion is adapted to move in/out of the first positioning hole or the second positioning hole along the first sidewall or the second sidewall.

In an embodiment of the disclosure, one of the sliding bracket and the rotating mask includes a riveting element, and the other one includes a via, wherein the riveting element passes through the via so that the rotating mask is pivoted to the sliding bracket.

In an embodiment of the disclosure, the sliding bracket includes a first via, and the rotating mask includes a second via. A hinge passes through the first via and the second via so that the rotating mask is pivoted to the sliding bracket.

With the above mechanical design, in the receiving status, the fixing bracket and the sliding bracket are adapted to be disposed in the casing and a portion of the rotating mask is exposed from the casing. When the back opening of the casing is to be shielded, the rotating mask is adapted to follow the sliding bracket to move relative to the fixing bracket toward the first direction to a position out of the casing, and is adapted to rotate relative to the sliding bracket and shield the back opening after being moved out of the casing. In this manner, the rotating mask can be rotated after being moved out of the casing to achieve a shielding status; when the shield is not required, the back cover module can be directly received in the casing without being removed.

In order to make the aforementioned features and advantages of the disclosure more comprehensible, embodiments accompanying figures are described in detail below.

DESCRIPTION OF EMBODIMENTS

Figure 1:
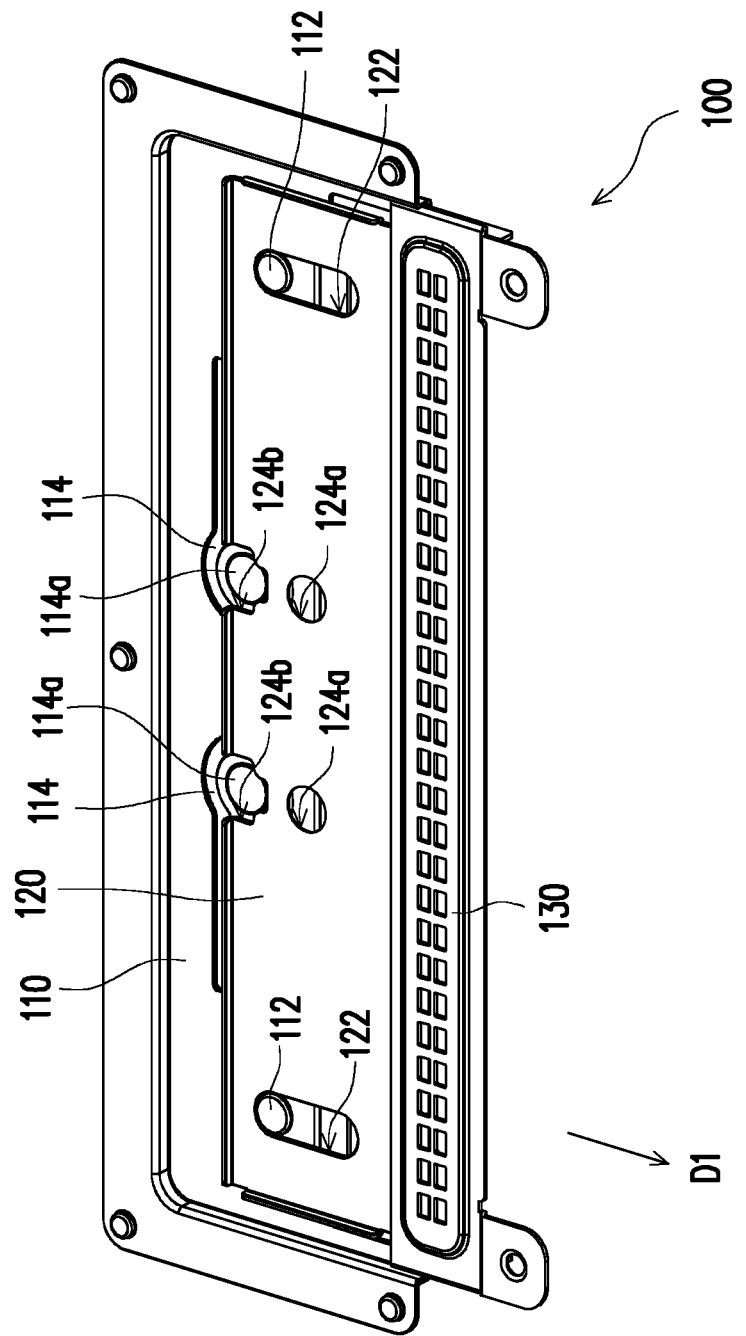
FIG. 1 is a schematic perspective view illustrating a back cover module according to an embodiment of the disclosure.
Figure 2A:
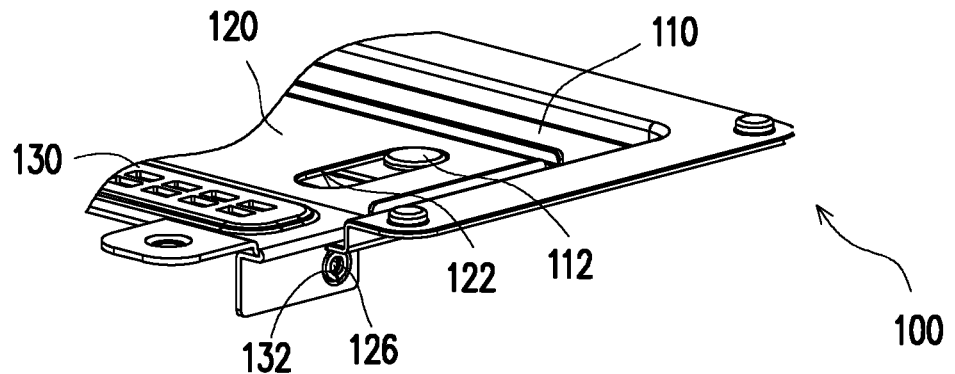
FIG. 2A is a side view illustrating a portion of the back cover module in FIG. 1.
Figure 2B:
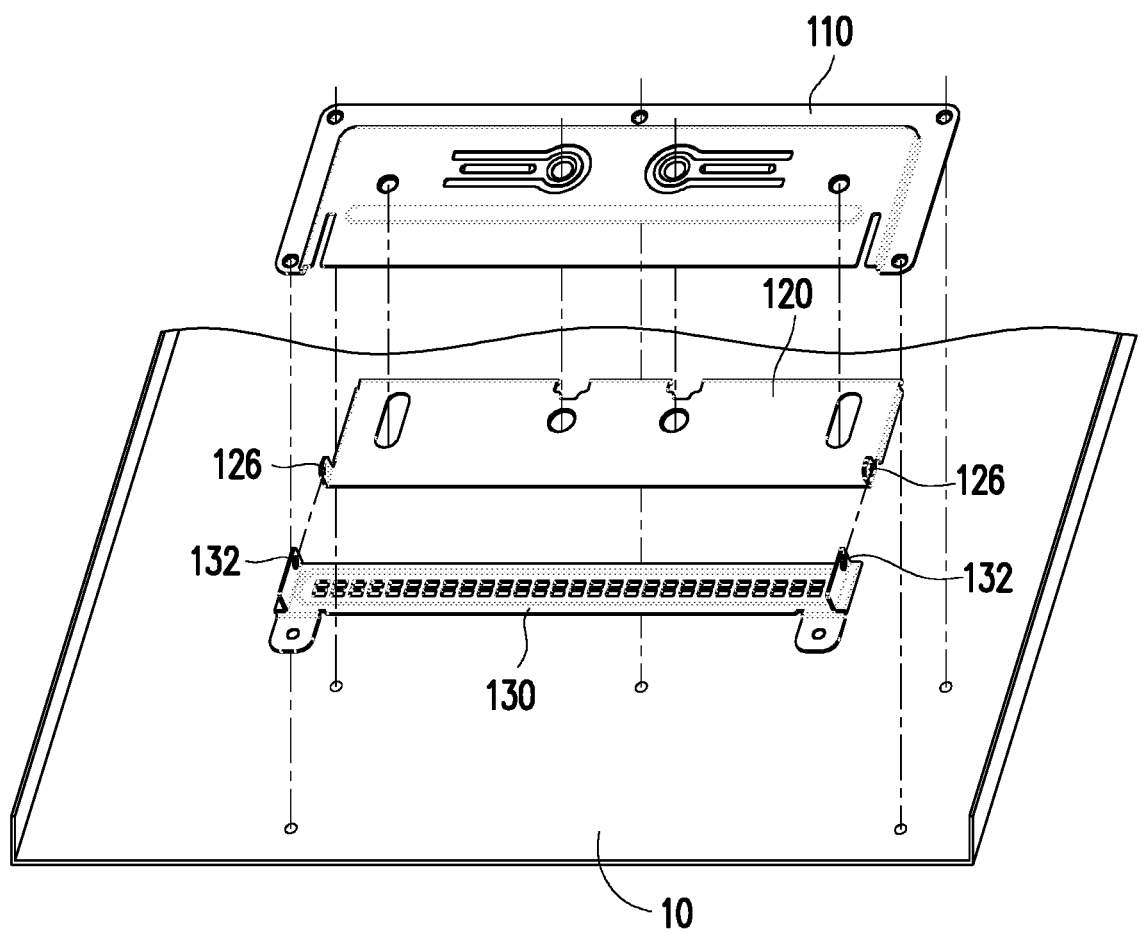
FIG. 2B is an exploded view illustrating a casing and the back cover module in FIG. 1.

FIG. 1 is a schematic perspective view illustrating a back cover module according to an embodiment of the disclosure. FIG. 2A is a side view illustrating a portion of the back cover module in FIG. 1. FIG. 2B is an exploded view illustrating a casing and the back cover module in FIG. 1. Referring to FIG. 1 to FIG. 2B, a back cover module 100 in the embodiment is adapted to be disposed on a casing 10. The casing 10 has a back opening 12 (shown in FIG. 3A). The back cover module 100 includes a fixing bracket 110, a sliding bracket 120 and a rotating mask 130. The fixing bracket 110 is adapted to be fixed to a position of the casing 10 adjacent to the back opening 12. The sliding bracket 120 is slidably disposed on the fixing bracket 110 along a first direction D1. The rotating mask 130 is pivoted to the sliding bracket 120.

One of the fixing bracket 110 and the sliding bracket 120 includes a sliding slot 122 extending along the first direction D1, and the other one includes a sliding portion 112 extending into the sliding slot 122. In the embodiment, the fixing bracket 110 includes the sliding portion 112, and the sliding bracket 120 includes the sliding slot 122. In other embodiments, it may be that the fixing bracket 110 includes the sliding slot, and the siding bracket 120 includes the sliding portion.

One of the fixing bracket 110 and the sliding bracket 120 includes a position-limiting spring arm 114, and the other one includes a first positioning hole 124a and a second positioning hole 124b. In the embodiment, the fixing bracket 110 includes the position-limiting spring arm 114, and the sliding bracket 120 includes the first positioning hole 124a and the second positioning hole 124b. In other embodiments, it may be that the fixing bracket 110 includes the first positioning hole and the second positioning hole, and the sliding bracket 120 includes the position-limiting spring arm.

In the embodiment, since the numbers of the sliding portions 112 and the position-limiting spring arms 114 of the fixing bracket 110 are two, respectively, the numbers of the sliding slots 122, the first positioning holes 124a and the second positioning holes 124b of the sliding bracket 120 are correspondingly two, respectively. In other embodiments, the numbers and the forms of the sliding portions 112, the position-limiting spring arms 114, the sliding slots 122, the first positioning holes 124a and the second positioning holes 124b are not limited to the illustration.

Additionally, one of the sliding bracket 120 and the rotating mask 130 includes a riveting element 126 (shown in FIG. 2A), and the other one includes a via 132 (shown in FIG. 2A), wherein the riveting element 126 passes through the via 132 so that the rotating mask 130 is pivoted to the sliding bracket 120. In the embodiment, the sliding bracket 120 includes the riveting element 126, the rotating mask 130 includes the via 132. In other embodiments, it may be that the sliding bracket 120 includes the via, and the rotating mask 130 includes the riveting element.

Figure 3A:
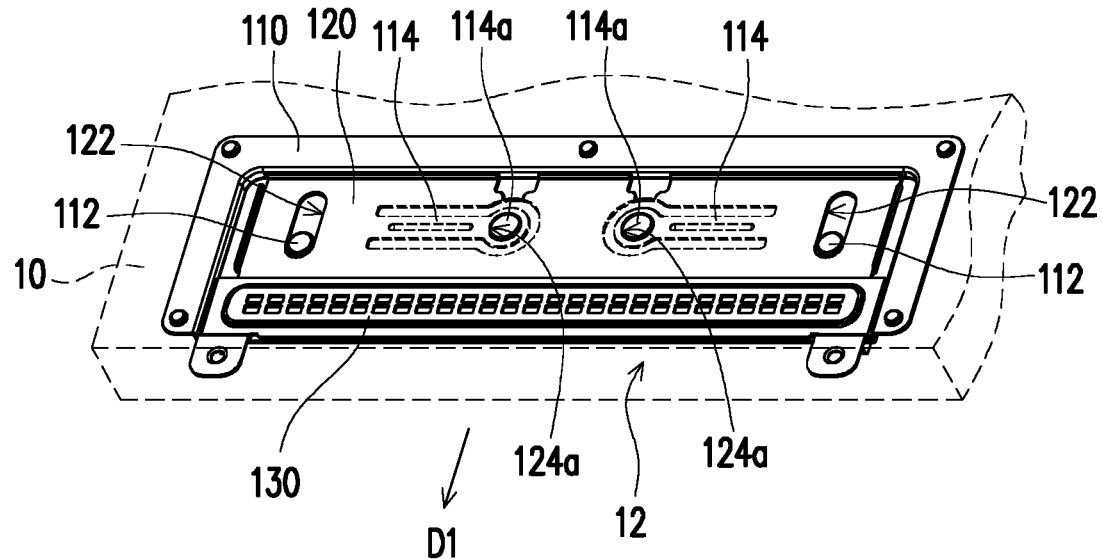
FIG. 3A to FIG. 3C are schematic views illustrating actuation of the back cover module in FIG. 1.
Figure 3B:
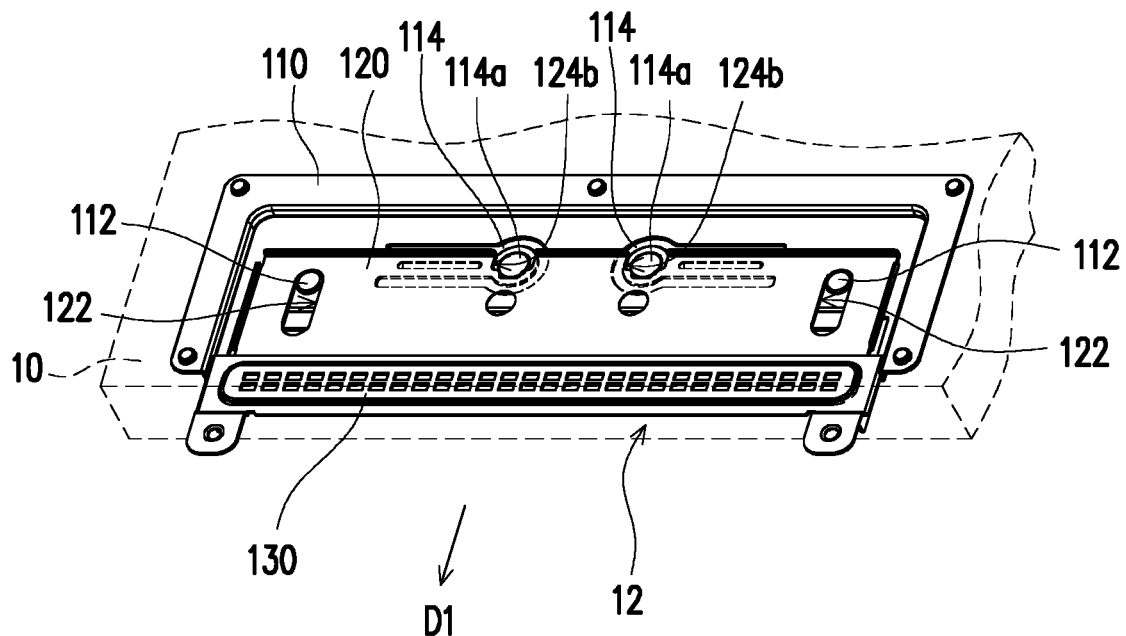
Figure 3C:
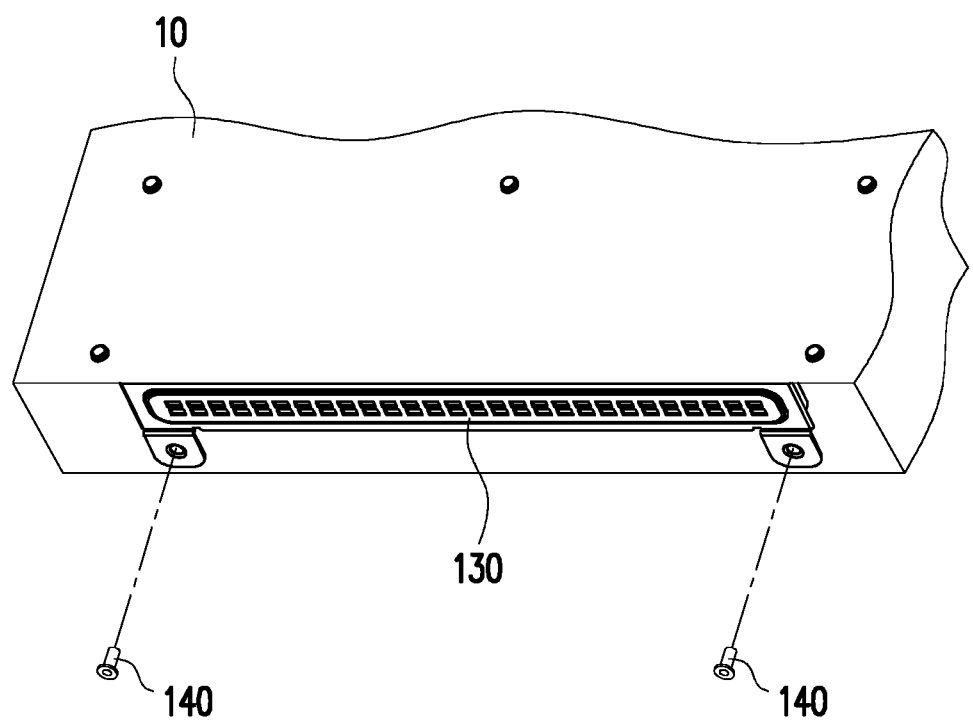

FIG. 3A to FIG. 3C are schematic views illustrating actuation of the back cover module in FIG. 1. In FIG. 3A and FIG. 3B, in order to clearly show the position relation between the sliding bracket 120 and the rotating mask 130 of the back cover module 100, the back cover module 100 is illustrated with solid line, and the casing 10 is illustrated with dashed line. Referring to FIG. 3A, when the sliding bracket 120 and the rotating mask 130 are at a starting position, and the fixing bracket 110 is fixed to the casing 10, the fixing bracket 110 and the sliding bracket 120 are adapted to be disposed in the casing 10 and a portion of the rotating mask 130 is exposed from the casing 10. At this time, a protrusion 114a of the position-limiting spring arm 114 engages the first positioning hole 124a. The sliding portion 112 abuts against one end of the sliding slot 122 adjacent to an opening 12. However, in other embodiments, the sliding portion 112 may not abut against one end of the sliding slot 122 adjacent to the opening 12.

In the process that the rotating mask 130 of the back cover module 100 is withdrawn from the casing 10, the sliding bracket 120 is moved relative to the fixing bracket 110 toward the first direction D1. At this time, the sliding portion 112 of the fixing bracket 110 is moved relatively in the sliding slot 122 of the sliding bracket 120. The rotating mask 130 is adapted to follow the sliding bracket 120 to move toward the first direction D1 (e.g., the rear of the casing 10) to a position out of the casing 10. Referring to FIG. 3B, at this time, the sliding bracket 120 and the rotating mask 130 are located at a terminal position, the protrusion 114a of the position-limiting spring arm 114 engages the second positioning hole 124b, the sliding portion 112 abuts against one end of the sliding slot 122 away from the opening 12. However, in other embodiments, the sliding portion 112 may not abut against one end of the sliding slot 122 adjacent to the opening 12. Herein, the configurations of the first positioning hole 124a and the second positioning hole 124b allow the user to have different touch in the pushing process so that the user can know whether the sliding bracket 120 and the rotating mask 130 are pushed to the starting position or the terminal position. Moreover, when the casing 10 is shaken or transported, by engaging the protrusion 114a of the position-limiting spring arm 114 with the first positioning hole 124a, the sliding bracket 120 and the rotating mask 130 are not detached from the fixing bracket 110 when the fixing bracket 110 is shaken. In this manner, it can be avoided that the sliding bracket 120 and the rotating mask 130 slide toward the first direction D1 in the shaking process.

Thereafter, referring to FIG. 3C, after the rotating mask 130 is moved out of the casing 10, the rotating mask 130 is adapted to use the riveting element 126 of the sliding bracket 120 as a fulcrum to rotate relative to the sliding bracket 120 and shield the back opening 12. Moreover, the rotating mask 130 may be fixed to the casing 10 via a screw 140. In this manner, when the shield is required, the rotating mask 130 can be withdrawn to shield the back opening 12 of the casing 10. When the shield is not required, the rotating mask 130 can be directly received in the casing without being removed.

Figure 4:
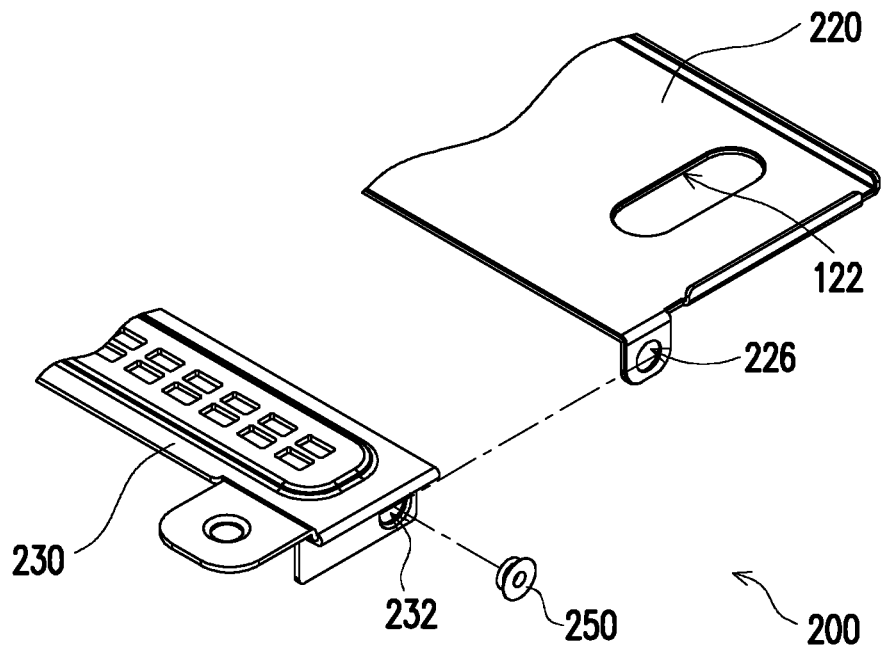
FIG. 4 and FIG. 5 are exploded views illustrating two back cover modules according to other embodiments of the disclosure.
Figure 5:
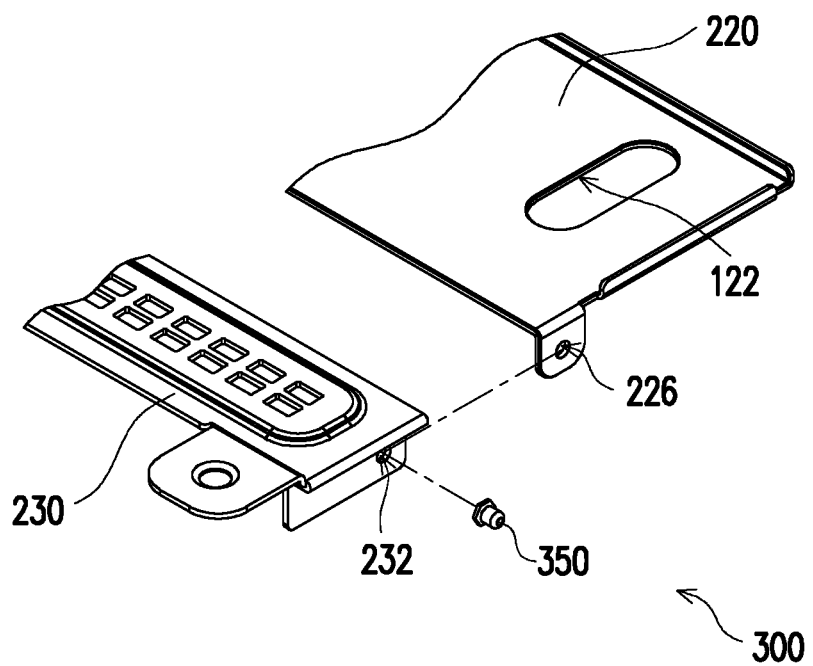

The following embodiment provides other aspects of the methods for pivoting the sliding bracket and the rotating mask. FIG. 4 and FIG. 5 are exploded views illustrating two back cover modules according to other embodiments of the disclosure. In FIG. 4 and FIG. 5, in order to clearly show the pivoting relation between the sliding bracket and the rotating mask, the fixing bracket is omitted from the drawings. Referring to FIG. 4, the main difference between the embodiment of FIG. 4 and the embodiment of FIG. 1 lies in the way that the sliding bracket and the rotating mask is pivoted together. In FIG. 1, the sliding bracket 120 of the back cover module 100 includes the riveting element 126 (shown in FIG. 2A), and the rotating mask 130 includes the via 132 (shown in FIG. 2A), wherein the riveting element 126 passes through the via 132 so that the rotating mask 130 is pivoted to the sliding bracket 120. In FIG. 4, a sliding bracket 220 of a back cover module 200 includes a first via 226, and a rotating mask 230 includes a second via 232. A hinge 250 passes through the first via 226 and the second via 232 so that the rotating mask 230 is pivoted to the sliding bracket 220.

Referring to FIG. 5, the main difference between the embodiment of FIG. 5 and the embodiment of FIG. 4 lies in the forms of the hinge 250 and 350. In FIG. 4, the hinge 250 of the back cover module 200 is a pop-rivet. In FIG. 5, a hinge 350 of a back cover module 300 may be a PIN-type rivet or an I-shape rivet. In other embodiments, the hinge 250 of the back cover module 200 or the hinge 350 of the back cover module 300 may be a screw.

Figure 6:
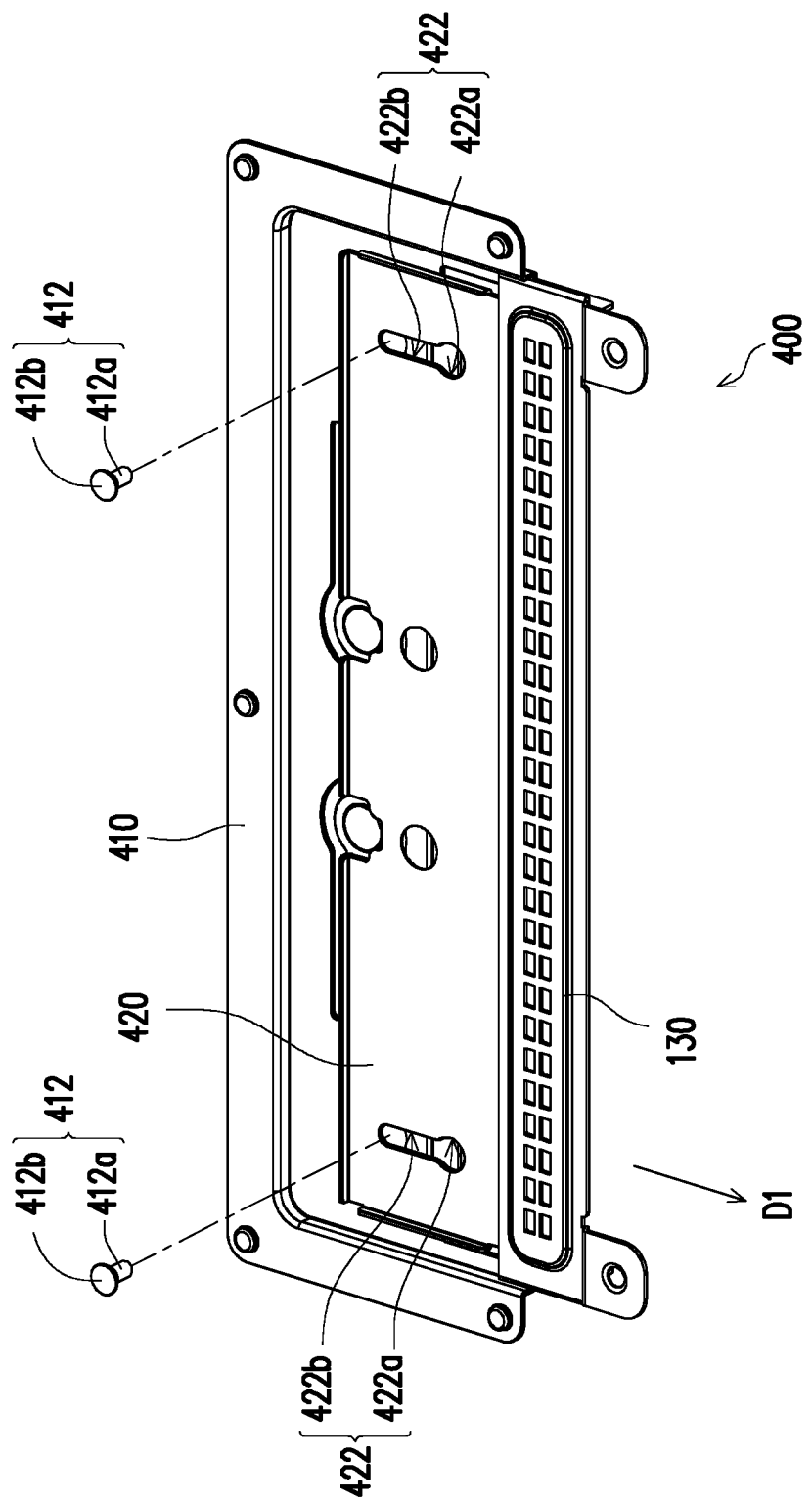
FIG. 6 and FIG. 7A are schematic perspective views illustrating two back cover modules according to other embodiments of the disclosure.
Figure 7A:
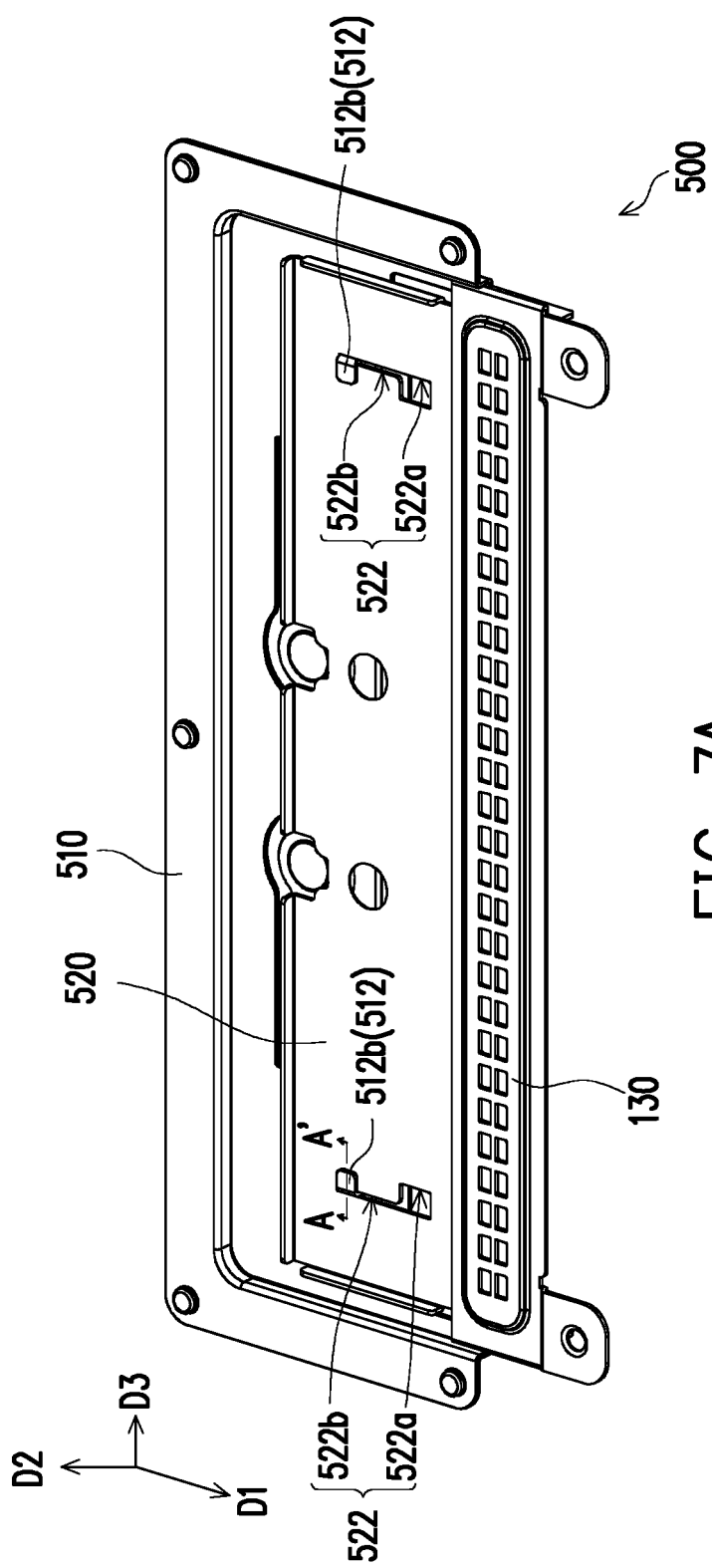

The following embodiment provides other aspects of the forms of sliding portion and the sliding slot. FIG. 6 and FIG. 7A are schematic perspective views illustrating two back cover modules according to other embodiments of the disclosure. In FIG. 6, in order to clearly show the contour of the sliding portion, the sliding portion is illustrated in an exploded manner. Referring to FIG. 6, the main difference between the embodiment of FIG. 6 and the embodiment of FIG. 1 lies in the forms of the sliding portion and the sliding slot. In FIG. 1, the sliding portion 112 of the back cover module 100 is a round bump, and the width of the sliding portion 112 is smaller or equal to the width of the sliding slot 122. In FIG. 6, a sliding slot 422 of a sliding bracket 420 of a back cover module 400 includes an inlet area 422a and a sliding area 422b distributed along the first direction D1. The sliding portion 412 of the fixing bracket 410 includes a body 412a and a cap portion 412b connected to the body 412a. The width of the inlet area 422a is larger than the width of the cap portion 412b. The width of the cap portion 412b is larger than the width of the sliding area 422b. The width of the sliding area 422b is larger than the width of the body 412a. Herein, the cap portion 412b of the sliding portion 412 may pass through the sliding slot 422 via the inlet area 422a of the sliding slot 422, and the body 412a of the sliding portion 412 may be moved along the first direction D1 between two sidewalls of the sliding area 422b.

Figure 7B:
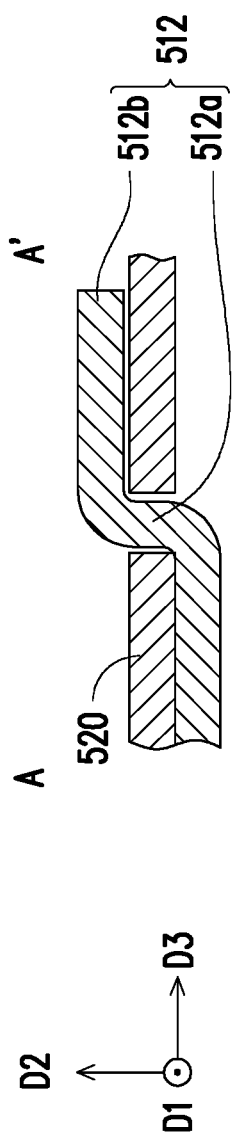
FIG. 7B is a schematic view of FIG. 7A taken long line A-A'.

FIG. 7B is a schematic view of FIG. 7A taken long line A-A'. Referring to FIG. 7A and FIG. 7B, the main difference between the embodiment of FIG. 7A and the embodiment of FIG. 6 lies the forms of sliding portion and the sliding slot. In the embodiment, a sliding portion 512 of a fixing bracket 510 of a back cover module 500 includes a first segment 512a and a second segment 512b that are connected and bended. The first segment 512a extends along a second direction D2, the second segment 512b extends along a third direction D3, wherein the first direction D1, the second direction D2 and the third direction D3 are perpendicular to each other. In the embodiment, in terms of FIG. 7B, the first direction D is, for example, a direction perpendicular to the plan; the second direction D2 is, for example, a up-down direction of the plan; and the third direction D3 is, for example, a left-right direction of the plan. The width of the inlet area 522a is larger than the width of the second segment 512b, the width of the inlet area 522a is larger than the width of the sliding area 522b, and the width of the sliding area 522b is larger than the width of the first segment 512a. Herein, the second segment 512b of the sliding portion 512 may pass through a sliding slot 522 via the inlet area 522a of the sliding slot 522 of a sliding bracket 520, and the first segment 512a of the sliding portion 512 may be moved along the first direction D1 between two sidewalls of the sliding area 522b.

Further, the inlet area 422a of the sliding slot 422 in the embodiment of FIG. 6 is in a round shape, and the inlet area 522a of the sliding slot 522 of the embodiment is in a square shape. As compared with the sliding area 422b of the sliding slot 422 in the embodiment of FIG. 6, the width of the sliding area 522b in the embodiment is narrower. It should be indicated that the shapes of the inlet area 422a and the sliding area 422b in the embodiment of FIG. 6 respectively correspond to the shapes of the cap portion 412b and the body 412a. In the embodiment, the shapes of the inlet area 522a and the sliding area 522b in the embodiment respectively correspond to the shapes of the second segment 512b and the first segment 512a. However, in other embodiments, the shapes of the inlet area 422a and the sliding area 422b in the embodiment of FIG. 6 may not correspond to the shapes of the cap portion 412b and the body 412a, and the shapes of the inlet area 522a and the sliding area 522b in the embodiment may not correspond to the shapes of the second segment 512b and the first segment 512a. Herein, the size of the inlet area 422a in the embodiment of FIG. 6 only needs to allow the cap portion 412b to pass through the inlet area 422a, and the size of the sliding area 422b only needs to allow the body 412a to move in the sliding area 422b. In the embodiment, the size of the inlet area 522a only needs to allow the second segment 512b to pass through the inlet area 522a, and the size of the sliding area 522b only needs to allow the first segment 512a to move in the sliding area 522b. In other words, the contour of the sliding slot and the form of the sliding portion may be shown in other aspects, and the disclosure provides no limitation thereto.

Figure 8A:
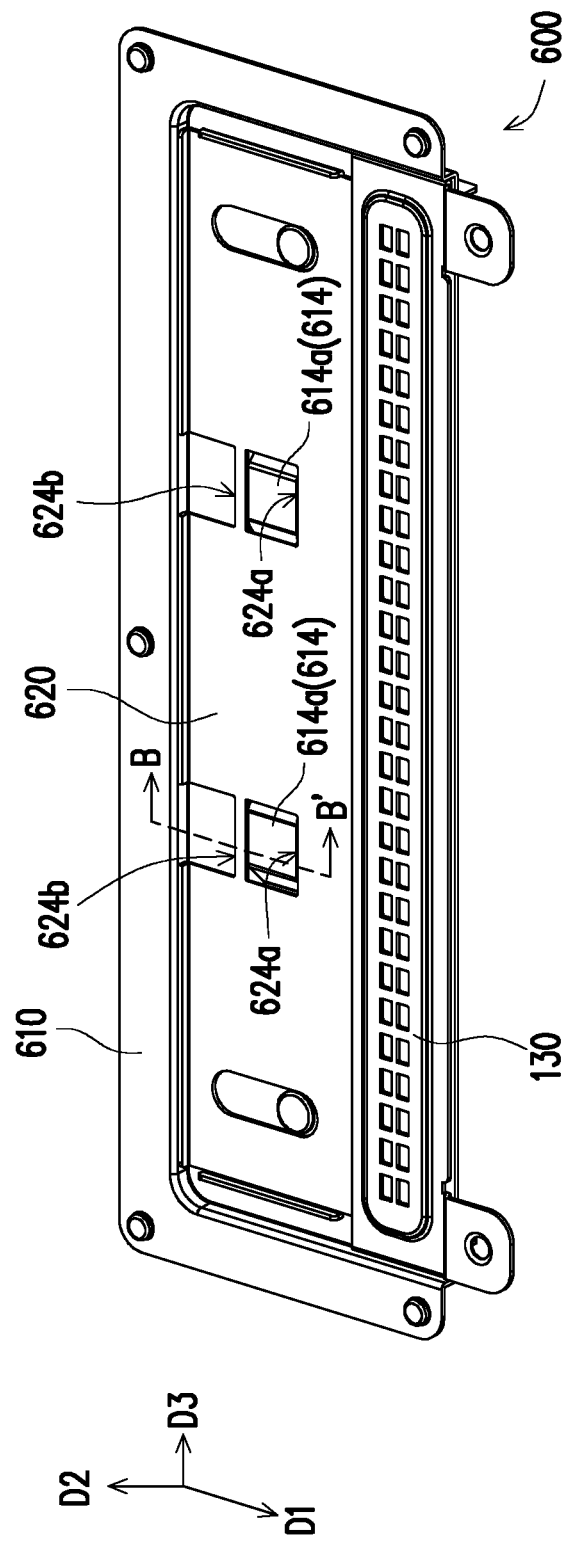
FIG. 8A is a schematic perspective view illustrating a back cover module according to another embodiment of the disclosure.
Figure 8B:
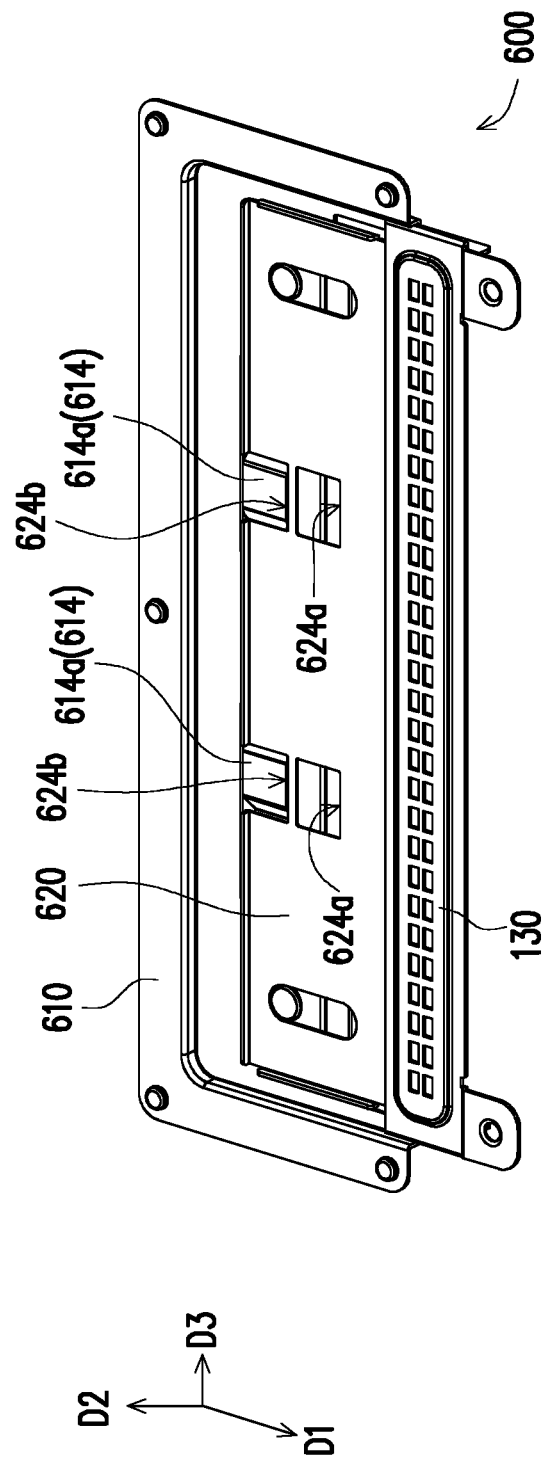
FIG. 8B is a schematic perspective view of the back cover module in FIG. 8A in a status where a sliding bracket and a rotating mask are moved to a terminal position.
Figure 8C:
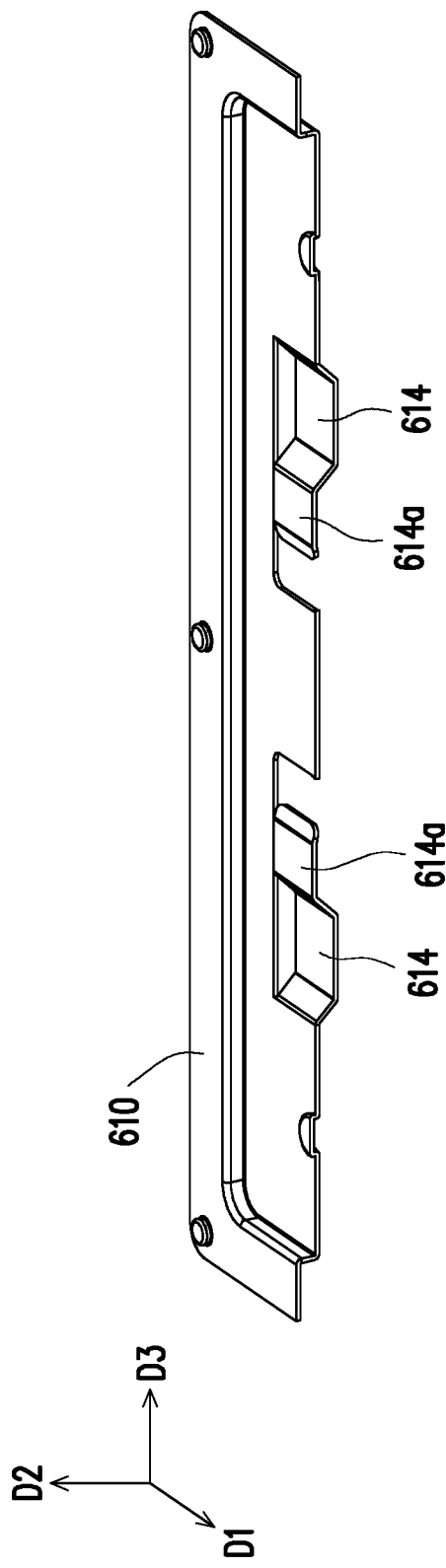
FIG. 8C is a schematic cross-sectional view illustrating a fixing bracket in FIG. 8A.

FIG. 8A is a schematic perspective view illustrating a back cover module according to another embodiment of the disclosure. FIG. 8B is a schematic perspective view of the back cover module in FIG. 8A in a status where the sliding bracket and the rotating mask are moved to a terminal position. FIG. 8C is a schematic cross-sectional view illustrating a fixing bracket in FIG. 8A. Referring to FIG. 8A, FIG. 8B and FIG. 8C, the main difference between the present embodiment and the embodiment of FIG. 1 lies in the forms of the position-limiting spring arm, the first positioning hole and the second positioning hole. In FIG. 1, the protrusion 114a of the position-limiting spring arm 114 and the first positioning hole 124a of the back cover module 100 are in a round shape, and the second positioning hole 124b is in an irregular shape. In the present embodiment, a protrusion 614a of a position-limiting spring arm 614, a first positioning hole 624a and a second positioning hole 624b of a back cover module 600 are in a rectangular shape, and the position-limiting spring arm 614 extends along the third direction D3 and the position-limiting spring arm 614 includes a plurality of connected and bended sections. However, in other embodiments, the forms of the position-limiting spring arm, the first position hole and the second positioning hole may be shown in other aspects, and the disclosure provides no limitation thereto.

Figure 8D:
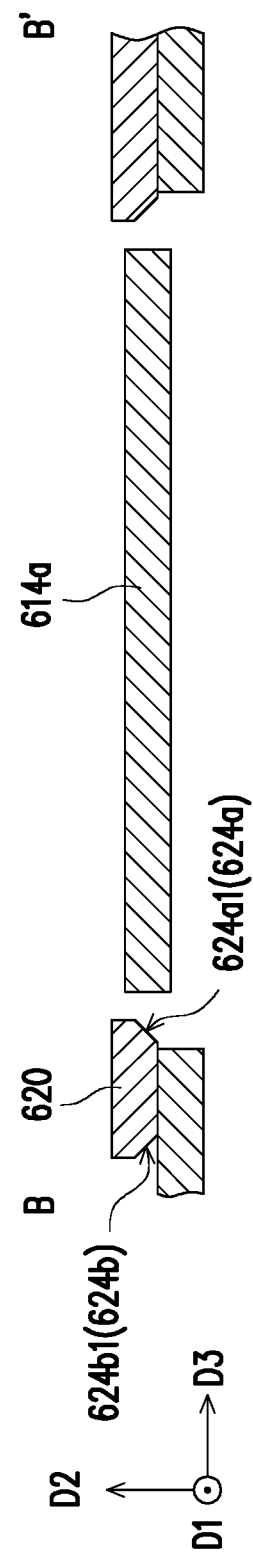
FIG. 8D is a schematic view of FIG. 8A taken along line B-B'.

FIG. 8D is a schematic view of FIG. 8A taken along line B-B'. Referring to FIG. 8A and FIG. 8D, on a fixing bracket 610 or a sliding bracket 620 which a first positioning hole 624a is disposed, a first sidewall 624a1 forming the first positioning hole 624a and a second sidewall 624b1 forming a second positioning hole 624b are respectively two inclined surfaces for allowing a protrusion 614a to move in/out of the first positioning hole 624a or the second positioning hole 624b along the first sidewall 624a1 or the second sidewall 624b1. In the embodiment, the first sidewall 624a1 of the first positioning hole 624a and the second sidewall 624b1 of the second positioning hole 624b are formed on the sliding bracket 620. In other embodiments, the first sidewall of the first positioning hole and the second sidewall of the second positioning hole may be formed on the fixing bracket 610.

Figure 9:
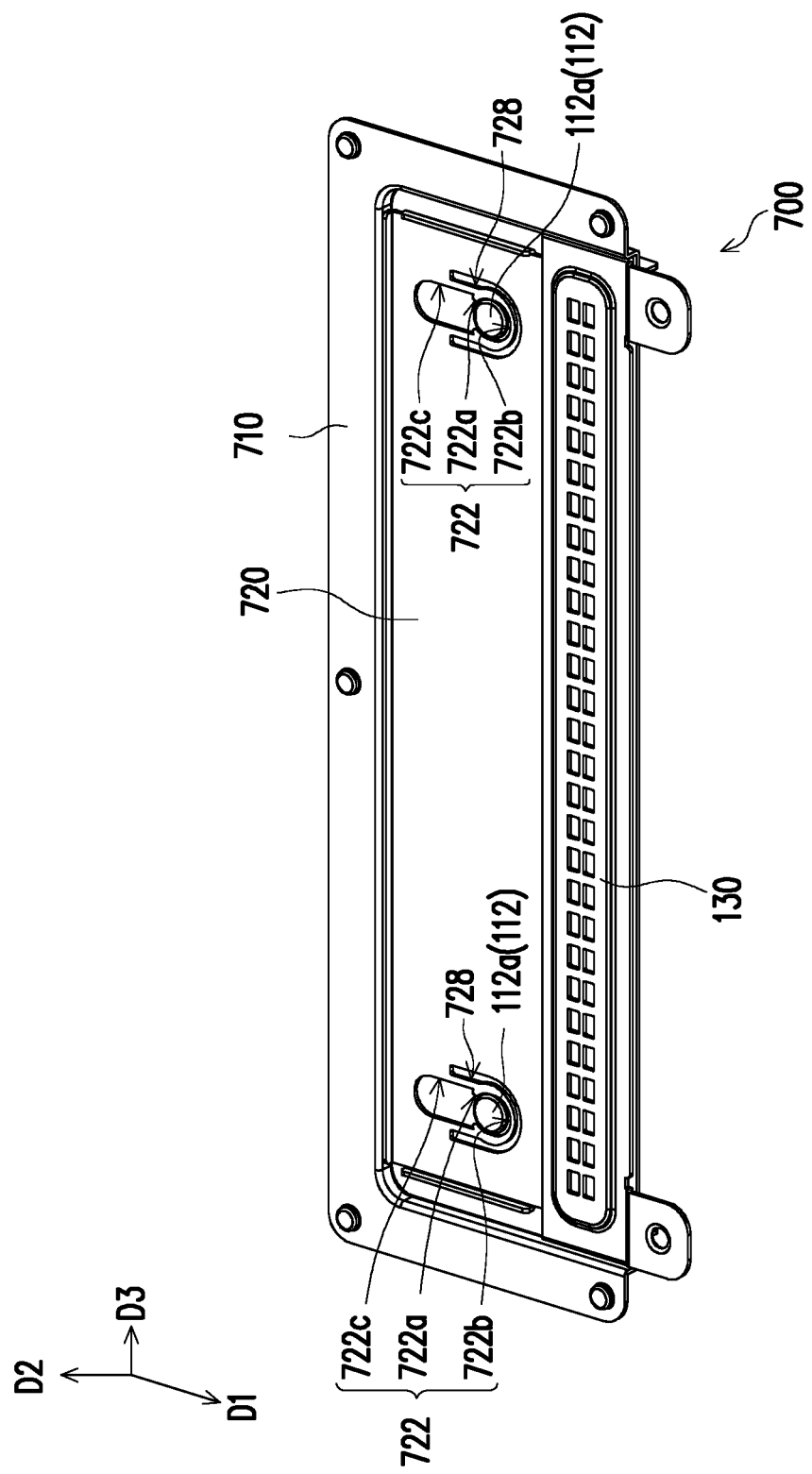
FIG. 9 is a schematic perspective view illustrating a back cover module according to yet another embodiment of the disclosure.

FIG. 9 is a schematic perspective view illustrating a back cover module according to yet another embodiment of the disclosure. Referring to FIG. 9, the main difference between the present embodiment and the embodiment of FIG. 1 is that, in the present embodiment, the first positioning hole, the second positioning hole and the corresponding position-limiting spring arm in the embodiment of FIG. 1 are integrated with the sliding slot so that the sliding slot can simultaneously have the positioning function and provide a sliding space. In the embodiment, a fixing bracket 710 of a back cover module 700 only has the sliding portion 112 as shown in FIG. 1 without the position-limiting spring arm 114 shown in FIG. 1, and a sliding slot 722 includes a shrinking area 722a adjacent to one end, and is divided into a positioning area 722b and a sliding area 722c. Herein, the positioning area 722b of the sliding slot 722 may provide a positioning function, and the sliding area 722c may provide a sliding space. Specifically, when the sliding bracket 720 and the rotating mask 130 are located at the starting position, the sliding portion 112 of the fixing bracket 710 engages the positioning area 722b of the sliding bracket 720. When the rotating mask 130 is withdrawn from the casing 10, the sliding portion 112 of the fixing bracket 710 may be moved in the sliding area 722c of the sliding bracket 720. Certainly, in other embodiments, it may be that both ends of the sliding slot each include an shrinking area, and the sliding slot is divided into two positioning areas and a sliding area between the two positioning areas, such that the sliding portion 112 may respectively engage a corresponding positioning area when the sliding bracket 720 and the rotating mask 130 are located at the starting position or the terminal position.

In the embodiment, the sliding portion 112 is a bump 112a, the widths of the positioning area 722b and the sliding area 722c are larger than the width of the bump 112a, and the width of the shrinking area 722a is smaller than the width of the bump 112a.

Additionally, in the embodiment, on the sliding bracket 720 on which the sliding slot 722 is disposed, a hole 728 is disposed on a portion of a periphery of one end of the sliding slot 722, such that the sliding portion 112 can be moved between the positioning area 722b and a sliding area 722c of the sliding slot 722. In the embodiment, the hole 728 is disposed on one side adjacent to the shrinking area 722a and the positioning area 722b, and the hole 728 extends along an outer periphery adjacent to the shrinking area 722a and the positioning area 722b. In other embodiments, the hole 728 may be only disposed on both sides adjacent to the shrinking area 722a, or the hole 728 may be disposed on one side adjacent to the sliding area 722c, which should not be construed as a limitation to the disclosure.

With the mechanical design descried above, in the receiving status, the fixing bracket and the sliding bracket are adapted to be disposed in the casing and a portion of the rotating mask is exposed from the casing. When the back opening of the casing is to be shielded, the rotating mask is adapted to follow the sliding bracket to move relative to the fixing bracket toward the first direction to a position out of the casing, and is adapted to rotate relative to the sliding bracket and shield the back opening after being moved out of the casing. In this manner, the rotating mask can be rotated to be in a shielded status after being moved out of the casing; when the shield is not required, the back cover module can be directly received in the casing without being removed.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A back cover module, adapted to be disposed on a casing, the casing having a back opening, the back cover module comprising:
   a fixing bracket, adapted to be fixed to a position of the casing adjacent to the back opening;
   a sliding bracket, slidably disposed on the fixing bracket along a first direction; and
   a rotating mask, pivoted to the sliding bracket, wherein when the fixing bracket is fixed to the casing, the fixing bracket and the sliding bracket are adapted to be disposed in the casing and a portion of the rotating mask is exposed from the casing,
   the rotating mask is adapted to follow the sliding bracket and move relative to the fixing bracket toward the first direction to a position out of the casing, and is adapted to rotate relative to the sliding bracket and shield the back opening after being moved out of the casing.

2. The back cover module according to claim 1, wherein one of the fixing bracket and the sliding bracket comprises a sliding slot extending along the first direction, and the other one comprises a sliding portion extending into the sliding slot.

3. The back cover module according to claim 2, wherein the sliding slot comprises an inlet area and a sliding area distributed along the first direction, the sliding portion comprises a body and a cap portion connected to the body, a width of the inlet area is larger than a width of the cap portion, the width of the cap portion is larger than a width of the sliding area, and the width of the sliding area is larger than a width of the body.

4. The back cover module according to claim 2, wherein the sliding portion comprises a first segment and a second segment being connected and bended, the first segment extends along a second direction, the second segment extends along a third direction, wherein the first direction, the second direction and the third direction are perpendicular to each other.

5. The back cover module according to claim 4, wherein the sliding slot comprises an inlet area and a sliding area distributed along the first direction, wherein in the third direction, a width of the inlet area is larger than a width of the second segment, a width of the sliding area is larger than a width of the first segment, and the width of the inlet area is larger than the width of the sliding area.

6. The back cover module according to claim 2, wherein the sliding slot comprises a shrinking area adjacent to one end of the sliding slot and is divided into a positioning area and a sliding area.

7. The back cover module according to claim 6, wherein the sliding portion comprises a bump, widths of the positioning area and the sliding area are larger than a width of the bump, and a width of the shrinking area is smaller than the width of the bump.

8. The back cover module according to claim 7, wherein on the fixing bracket or the sliding bracket on which the sliding slot is disposed, a hole is disposed on a portion of a periphery of one end of the sliding slot.

9. The back cover module according to claim 1, wherein one of the fixing bracket and the sliding bracket comprises a position-limiting spring arm, and the other one comprises a first positioning hole and a second positioning hole, wherein when the sliding bracket is located at a starting position, a protrusion of the position-limiting spring arm engages the first positioning hole, when the sliding bracket is located at a terminal position, the protrusion of the position-limiting spring arm engages the second positioning hole.

10. The back cover module according to claim 9, wherein on the fixing bracket or the sliding bracket on which the first positioning hole is disposed, a first sidewall forming the first positioning hole and a second sidewall forming the second positioning hole are two inclined surfaces respectively, and the protrusion is adapted to move in/out of the first positioning hole or the second positioning hole along the first sidewall or the second sidewall.

11. The back cover module according to claim 1, wherein one of the sliding bracket and the rotating mask comprises a riveting element, and the other one comprises a via, wherein the riveting element passes through the via so that the rotating mask is pivoted to the sliding bracket.

12. The back cover module according to claim 1, wherein the sliding bracket comprises a first via, and the rotating mask comprises a second via, a hinge passes through the first via and the second via such that the rotating mask is pivoted to the sliding bracket.

* * * * *